United States Patent
Wang et al.

(10) Patent No.: US 7,701,629 B2
(45) Date of Patent: Apr. 20, 2010

(54) PHOTONIC DEVICE INCLUDING SEMICONDUCTOR STRUCTURE HAVING DOPED REGION WITH ARRAY OF SUBWAVELENGH RECESSES

(75) Inventors: Shih-Yuan Wang, Palo Alto, CA (US); Alexandre M. Bratkovski, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 254 days.

(21) Appl. No.: 11/788,445

(22) Filed: Apr. 19, 2007

(65) Prior Publication Data

US 2008/0259981 A1    Oct. 23, 2008

(51) Int. Cl.
  *G02B 1/03*  (2006.01)
(52) U.S. Cl. ...................................... 359/248; 359/245
(58) Field of Classification Search .................. 359/248, 359/247, 245, 238, 237
See application file for complete search history.

(56) References Cited

U.S. PATENT DOCUMENTS 6,040,936 A  3/2000 Kim et al.
2004/0150873 A1* 8/2004 Pearsall ...................... 359/321

OTHER PUBLICATIONS

Ebbesen, T. W., et al., "Extraordinary optical transmission through sub-wavelength hole arrays", Nature, vol. 391, Feb. 12, 1998, pp. 667-669.
Barnes, William L., et al., "Surface plasmon subwavelength optics", Nature, vol. 424, Aug. 14, 2003, pp. 824-830.

* cited by examiner

*Primary Examiner*—Timothy J Thompson

(57) ABSTRACT

Various aspects of the present invention are directed to photonic devices, such as electro-optic modulators, passive filters, and tunable filters. In one aspect of the present invention, a photonic device includes a semiconductor structure having a p-region and an n-region. A doped region is formed on or within the semiconductor structure. The doped region includes at least one generally periodic array of recesses, with the at least one generally periodic array configured to transmit electromagnetic radiation at a selected dominant wavelength. The selected dominant wavelength is tunable by varying the refractive index of the semiconductor structure.

25 Claims, 14 Drawing Sheets

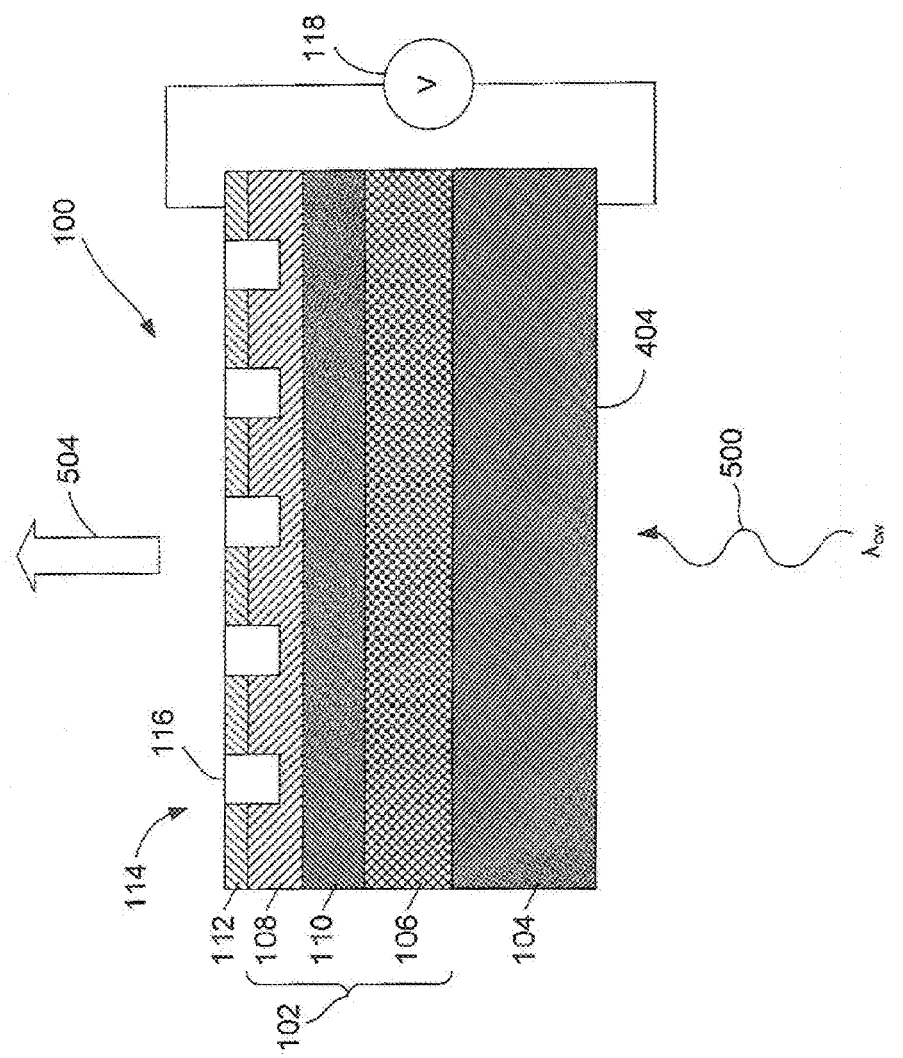

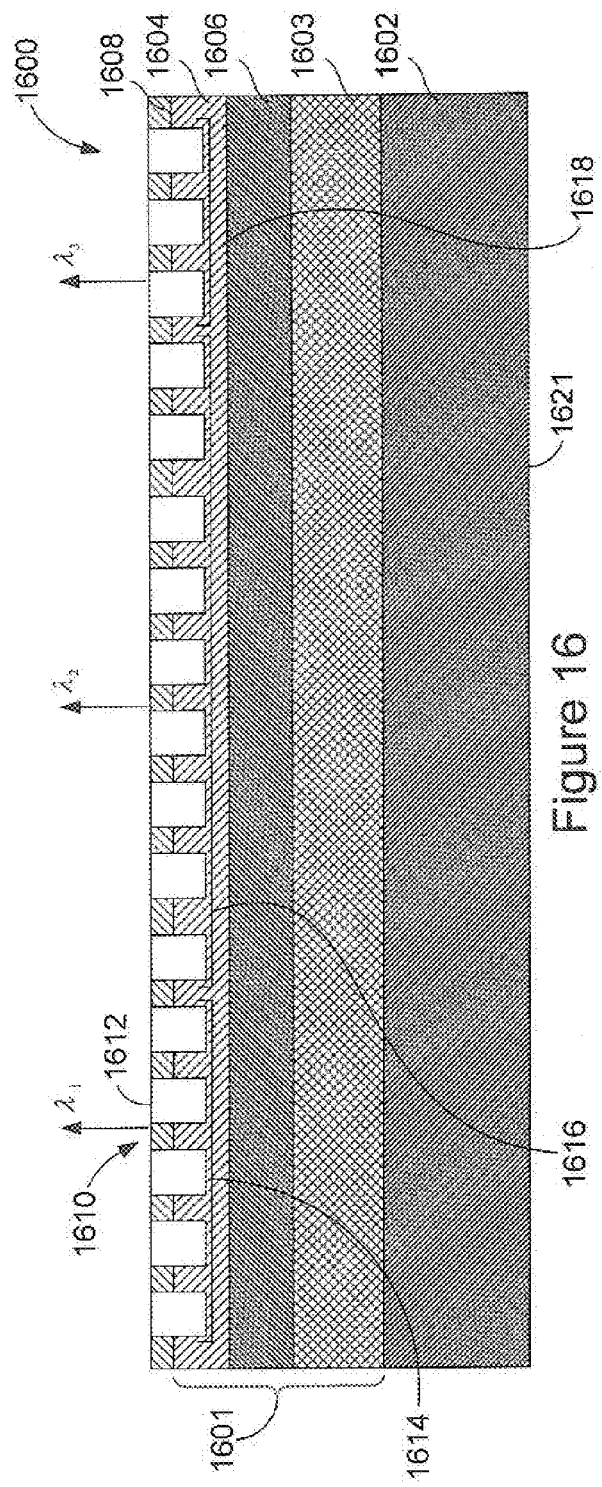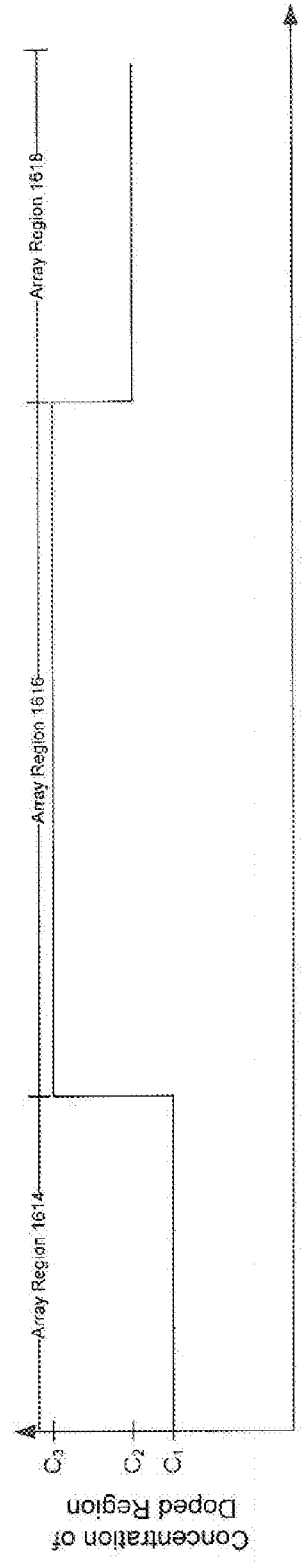
Figure 16
Figure 17

PHOTONIC DEVICE INCLUDING SEMICONDUCTOR STRUCTURE HAVING DOPED REGION WITH ARRAY OF SUBWAVELENGH RECESSES

TECHNICAL FIELD

Embodiments of the present invention relate generally to photonic devices, such as electro-optic modulators, passive filters, and tunable filters.

BACKGROUND

Since the late 1970s, waveguides have increasingly supplanted conventional signal lines for transmitting information. Rather than encoding information in electrical signals and transmitting the encoded electrical signals via signal lines, the same information can be encoded in a channel of electromagnetic radiation and transmitted via waveguides, such as optical fibers, ridge waveguides, and photonic crystal waveguides. The term "channel," also called "optical channel," refers to electromagnetic radiation transmitted at one wavelength through a waveguide. Transmitting information encoded in channels via waveguides has a number of advantages over transmitting encoded electrical signals via signal lines. First, degradation or loss is much less for channels transmitted via waveguides than for electrical signals transmitted via signal lines. Second, waveguides can be fabricated to support a much higher bandwidth than signal lines. For example, a single copper or aluminum wire can only transmit a single electrical signal, while a single optical fiber can be configured to transmit about 100 or more channels. Finally, electromagnetic radiation provides, in general, a much higher transmission rate.

Recently technological advances in semiconductor fabrication techniques have made it possible to fabricate waveguides that can be integrated with electronic devices, such as memory and processors, to form photonic integrated circuits ("PICs"), where the waveguides may be used to transmit information encoded in channels between the electronic devices. PICs are the photonic equivalent of electronic integrated circuits and may be implemented on a small substrate of semiconductor material that forms the base of the electronic devices.

In order to effectively implement PICs, passive and active photonic components are needed. Waveguides, attenuators, and filters are examples of passive photonic components that can be fabricated using conventional epitaxial and lithographic methods and may be used to direct the propagation of channels between electronic devices and filter channels. Active photonic components include electro-optic modulators. Accordingly, physicists, engineers, and computer scientists continue to seek improved active and passive photonic components for use in PICs or other photonic systems.

SUMMARY

Various aspects of the present invention are directed to photonic devices, such as electro-optic modulators, passive filters, and tunable filters. In one aspect of the present invention, a photonic device includes a semiconductor structure having a p-region and an n-region. A doped region is formed on or within the semiconductor structure. The doped region includes at least one generally periodic array of recesses, with the at least one generally periodic array configured to transmit electromagnetic radiation at a selected dominant wavelength. The selected dominant wavelength is tunable by varying the refractive index of the semiconductor structure.

BRIEF DESCRIPTION OF THE DRAWINGS

The drawings illustrate various embodiments of the present invention, wherein like reference numerals refer to like elements or features in different views or embodiments shown in the drawings.

FIG. 5A is a schematic cross-sectional view of the photonic device shown in FIG. 1 operated as an electro-optic modulator according to one embodiment of the present invention.

FIG. 5B is a graph of different zero-order transmission spectrums for the periodic array of the photonic device shown in FIG. 5A when different selected voltages are applied to the photonic device.

FIG. 16 is a schematic cross-sectional view of a photonic device that includes a periodic array having subwavelength-dimensioned recesses and a dopant concentration that varies laterally according to another embodiment of the present invention.

FIG. 17 is a graph of the dopant concentration in the doped region shown in FIG. 16.

DETAILED DESCRIPTION OF VARIOUS EMBODIMENTS

Figure 1:
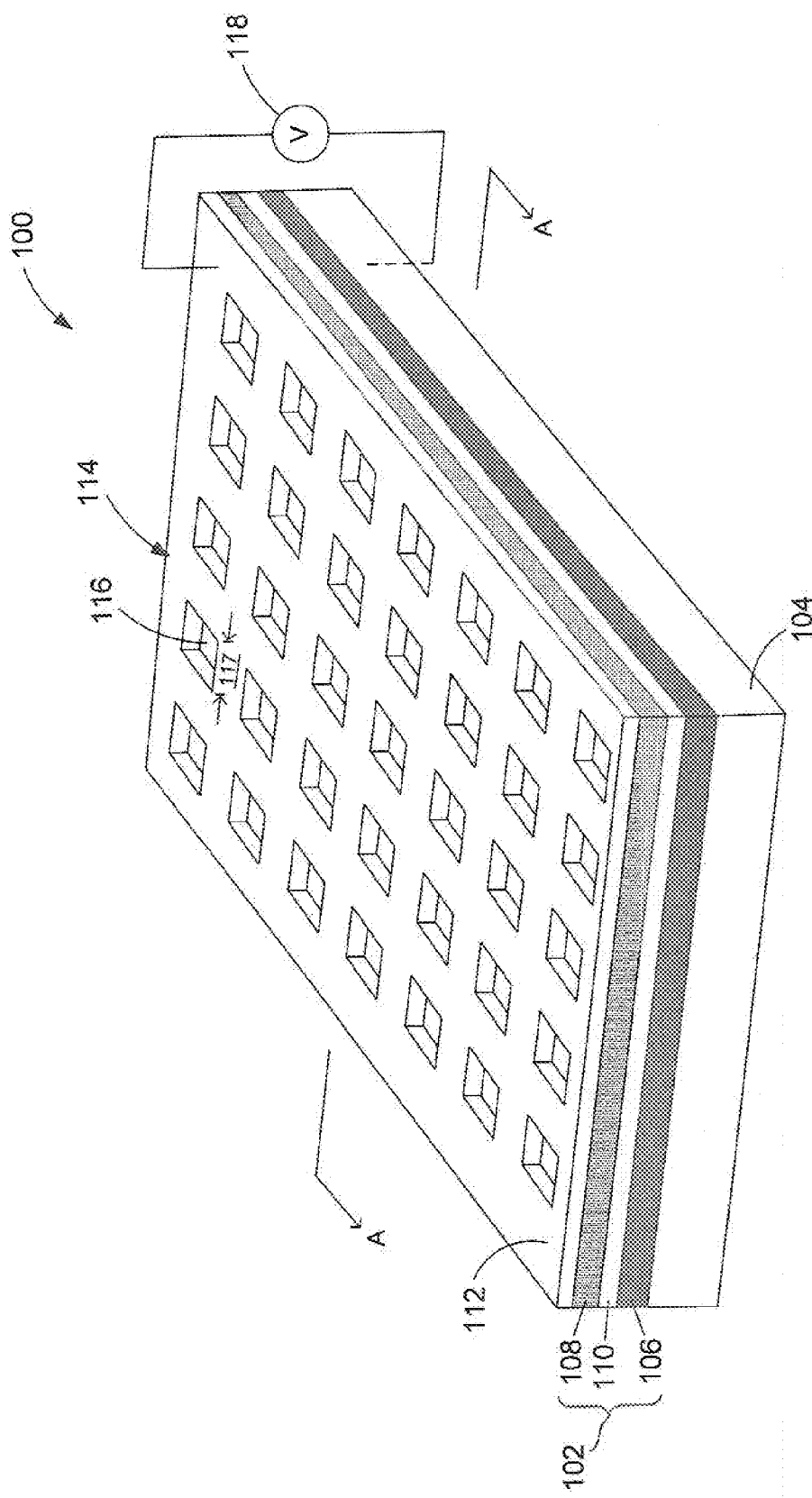
FIG. 1 is a schematic isometric view of a photonic device according to one embodiment of the present invention.
Figure 2:
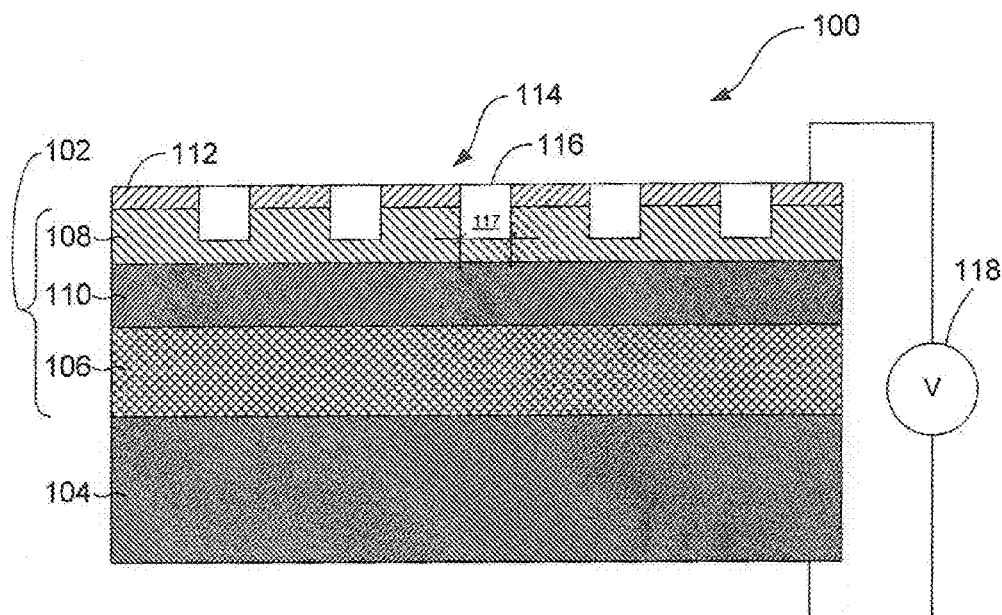
FIG. 2 is a schematic cross-sectional view of the photonic device shown in FIG. 1.

Various embodiments of the present invention are directed to photonic devices, such as electro-optic modulators, passive filters, and tunable filters. FIGS. 1 and 2 show a photonic device 100, which can be operated as an electro-optic modulator, a passive filter, or a tunable filter, according to one embodiment of the present invention. The photonic device 100 includes a semiconductor structure 102 formed on a substrate 104. The semiconductor structure 102 includes an n-semiconductor region 106, a p-semiconductor region 108, and an intrinsic semiconductor region 110 located between the n-semiconductor region 106 and the p-semiconductor region 108.

In the illustrated embodiment, a thin doped region 112 is formed on or within the p-semiconductor region 108. The thin doped region 112 may be formed within the p-semiconductor region 108 by doping the p-semiconductor region 108. For example, a monolayer of dopant may be deposited on the p-semiconductor region 108 by sputtering, evaporation, atomic beam deposition, or another suitable technique. The monolayer and the semiconductor structure 102 may be annealed to diffuse the dopant into the p-semiconductor region 108 and form the thin doped region 112 having a delta-doped profile. A delta-doped profile generally follows a Dirac delta function and a maximum dopant concentration of the delta-doped profile may be about $10^{18}$ cm$^{-3}$ to about $10^{21}$ cm$^{-3}$. The thin doped region 112 may have a thickness of, for example, about 2 nm or less.

A periodic array 114 of subwavelength-dimensioned recesses 116 is formed within the thin doped region 112 using a number of different selective material removal techniques, such as photolithography, electron-beam lithography, focused-ion-beam milling, or another suitable technique. Each of the subwavelength-dimensioned recesses 116 has a lateral dimension 117, about one-fifth to about one-tenth the wavelength of electromagnetic radiation that can be transmitted through the periodic array 114. As shown in FIG. 2, each of the subwavelength-dimensioned recesses 116 extends past the thin doped region 112 and into the p-semiconductor region 108. Although each of the subwavelength-dimensioned recesses 116 is shown having a rectangular geometry, each of the subwavelength-dimensioned recesses 116 may have another geometry, such as a circular cross-sectional geometry or another suitable geometry. Moreover, the arrangement of the subwavelength-dimensioned recesses 116 represents merely one embodiment of the present invention, and other arrangements may be used.

Figure 3:
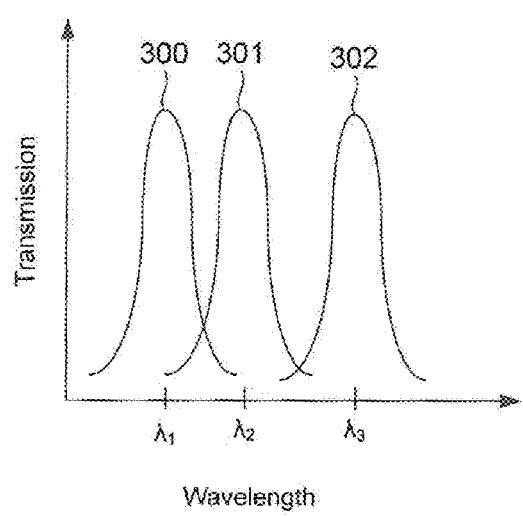
FIG. 3 is a graph illustrating zero-order transmission spectrums through the periodic array of the photonic device shown in FIGS. 1 and 2 for different periodic array designs.

The periodic array 114 of the subwavelength-dimensioned recesses 116 is configured to transmit electromagnetic radiation at a discrete, narrow wavelength band having a selected dominant wavelength at which maximum transmission through the periodic array 114 occurs. FIG. 3 shows a graph of the zero-order transmission spectrum through the thin doped region 112 for different configurations for the periodic array 114. The zero-order transmission spectrum is the spectrum where the wavevector of the incident electromagnetic radiation is substantially parallel to the wavevector of the electromagnetic radiation transmitted through the subwavelength-dimensioned recesses 116. For example, for one periodic array design, the zero-order transmission spectrum has a dominant wavelength at $\lambda_1$. For different periodic array designs, the zero-order transmission spectrum may be selectively changed. For example, zero-order transmission spectrums 301 and 302 have dominant wavelengths at $\lambda_1$ and $\lambda_2$, respectively. It is noted that the zero-order transmission spectrums 300-302 only show the lowest-order peak because the intensity of the lowest-order peak is significantly greater than the intensity of the higher order peaks. Accordingly, as used herein the term "dominant wavelength" refers to a wavelength of a lowest-order peak in a zero-order transmission spectrum.

The wavelength at which the dominant wavelength occurs and the shape of the zero-order transmission spectrum may be controllably varied by properly selecting the spacing of the recesses 116 of the periodic array 114, the lateral dimension 117 of the recesses 116, the thickness of the thin doped region 112, the geometry of the recesses 116, the free-electron concentration in the thin doped region 112, and the dielectric constant of the medium adjacent to the periodic array 114. It is currently believed that the enhanced transmission spectrum of electromagnetic radiation through the periodic array 114 of subwavelength dimensioned recesses 116 is a result of the periodic array 114 trapping electromagnetic waves and/or interaction of surface plasmon polaritons excited adjacent to the subwavelength-dimensioned recesses 116 in the thin doped region 112 at the interface between the p-semiconductor region 108 and the thin doped region 112 that interact with evanescent waves diffracted or scattered by the subwavelength recesses 116. Accordingly, varying any of the above-mentioned parameters varies the frequency of electromagnetic radiation capable of exciting surface plasmon resonance modes at the interface between the thin doped region 112 and the p-semiconductor region 108 and, consequently, the zero-order transmission spectrum and the dominant wavelength transmitted through the subwavelength recesses 116 of the periodic array 114.

As discussed briefly above, the zero-order transmission spectrum of the periodic array 114 may be selectively varied by altering the dielectric constant or refractive index of the medium adjacent to the periodic array 114. With reference to FIGS. 1 and 2, in various embodiments of the present invention, the photonic device 100 may further include a voltage source 118 coupled to the thin doped region 112 and the substrate 104. The voltage source 118 is operable to selectively apply a voltage across the thin doped region 112 and the substrate 104. Injecting electrons from the n-semiconductor region 106 into the p-semiconductor region 108 of the semiconductor structure 102 by applying a forward or reverse bias voltage with the voltage source 402 enables controllably varying the refractive index of the semiconductor structure 102 and, consequently, the refractive index of the p-semiconductor region 108 that is adjacent to the semiconductor structure 102. The zero-order transmission spectrum of the periodic array 114 depends on the structure and composition of the periodic array 114 (i.e., lateral dimension or diameter of the recesses 116, spacing of the recesses 116, free-electron concentration of the doped region 112, etc.) and the refractive index of the material adjacent to the periodic array 114. Accordingly, by controllably varying the refractive index of the semiconductor structure 102 adjacent to the periodic array 114, the wavelength of electromagnetic radiation that can be transmitted through the recesses 116 of the periodic array 114 may be selectively varied. For example, the zero-order transmission spectrums 300-302 may correspond to different voltages applied by the voltage source 118 and, consequently, different refractive indices for the semiconductor structure 102.

The semiconductor structure 102, thin doped region 112, and substrate 104 of the photonic device 100 may be formed from a number of different materials. For example, the n-semiconductor region 106 and the p-semiconductor region 108 may each be made from suitably doped single-crystal silicon. When the p-semiconductor region 108 is formed from silicon, the thin doped region 112 may formed by depositing a monolayer of platinum, titanium, tellurium, or cobalt. The monolayer is reacted with the silicon of the p-semiconductor region 108 to form a metal silicide. In other embodiments of the present invention, the n-semiconductor region 106 and the p-semiconductor region 108 may each be formed from suitably doped III-V semiconductor compounds, such as gallium arsenide ("GaAs") or indium phosphide ("InP"). In such embodiments, the thin doped region 112 may be formed by depositing a monolayer of carbon and annealing the monolayer to diffuse the carbon into the p-semiconductor region 108. It should also be noted that the positions of the n-semiconductor region 108 and the p-semiconductor region 110 may be switched. Accordingly, in other embodiments of the present invention, the thin doped region 112 may be formed in the n-semiconductor region 108.

Figure 4:
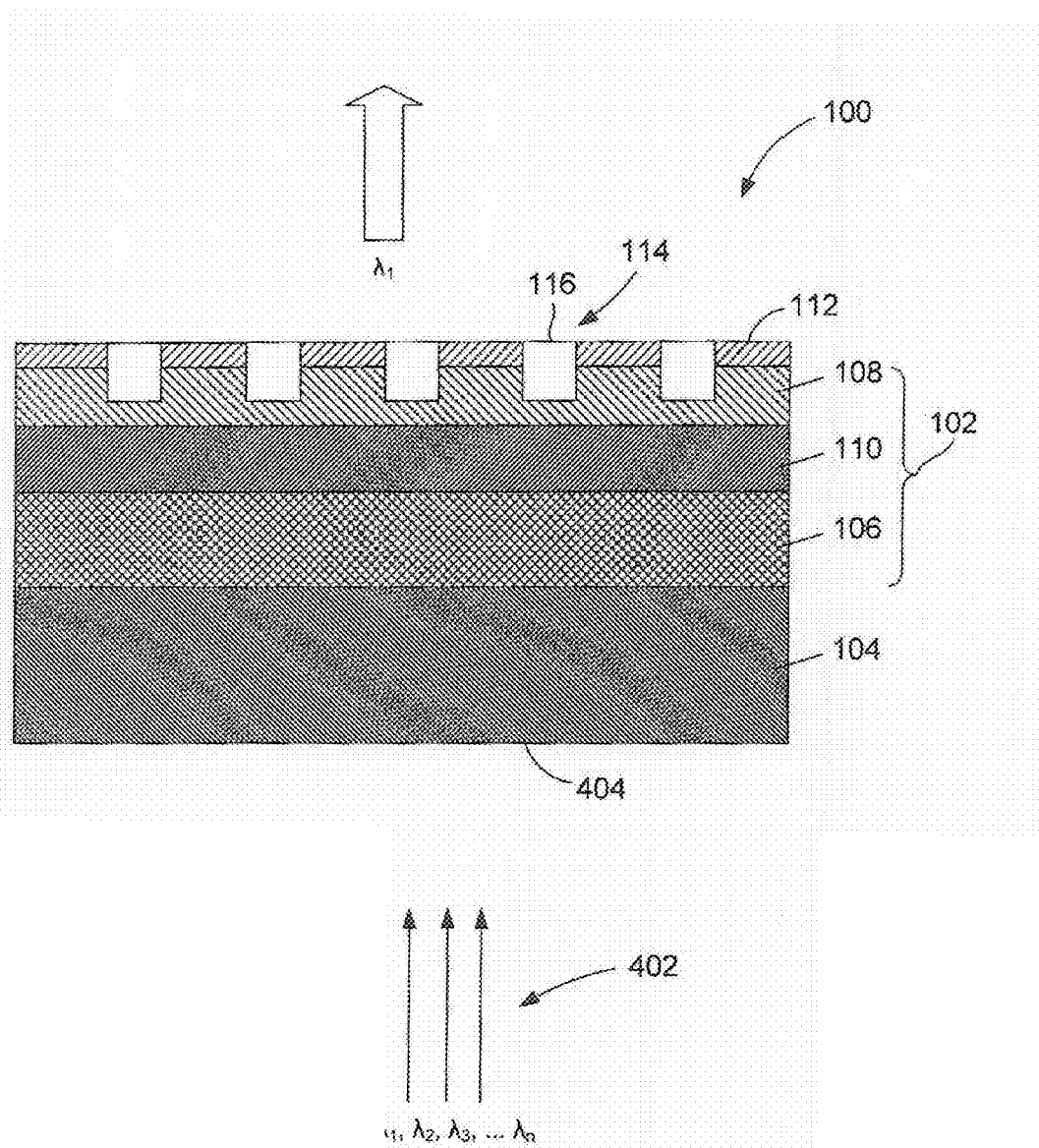
FIG. 4 is a schematic cross-sectional view of the photonic device shown in FIG. 1 operated as a filter or a wavelength-division multiplexer according to one embodiment of the present invention.

FIG. 4 illustrates operation of the photonic device 100 as a passive filter that only allows a narrow band of electromagnetic radiation, with one selected dominant wavelength, through the periodic array 114. In operation, electromagnetic radiation 402 having a wide range of wavelengths $\lambda_1$, $\lambda_2$, $\lambda_3$ ... $\lambda_n$ may be directed at a back surface 404 of the substrate 104 (as shown in FIG. 4) or an opposing front surface of the thin doped region 112. The electromagnetic radiation 402 that has an energy less than that of the energy band gap of the substrate 104 and the semiconductor structure 102 is transmitted through the substrate 104 and the semiconductor structure 102. The periodic array 114 may be configured to only allow transmission of one dominant wavelength of electromagnetic radiation through the periodic array 114. For example, the periodic array 114 may be configured so that only a zero-order transmission spectrum with a dominant wavelength at $\lambda_1$ is transmitted through the periodic array 114.

In a mode of operation according to another embodiment of the present invention, the photonic device 100 may be operated as a tunable filter for use as a wavelength-division multiplexer in, for example, an optical fiber system. In such an embodiment, the dominant wavelength allowed to be transmitted through the periodic array 114 may be controllably varied by applying a voltage across the semiconductor structure 102 to change the refractive index of the semiconductor structure 102. Accordingly, by applying a selected voltage, the dominant wavelength transmitted through the periodic array 114 may be controllably changed to allow, for example, electromagnetic radiation at a wavelength $\lambda_2$ or $\lambda_3$, to be transmitted through the periodic array 114 instead of electromagnetic radiation at a wavelength $\lambda_1$.

The ability to rapidly vary the refractive index of the semiconductor structure 102 enables modulating the intensity of a carrier channel transmitted through the photonic device 100 and, thus, encode information. FIG. 5A shows a mode of operation, according to another embodiment of the present invention, in which the photonic device 100 is operated as an electro-optic modulator. As shown in FIG. 5A, a carrier channel 500 having a wavelength $\lambda_{cw}$ irradiates the back surface 404 of the photonic device 100. Because the energy of the carrier channel 500 is less than the energy band gap of the substrate 104 and the semiconductor structure 102, the carrier channel 500 is transmitted through the substrate 104 and the semiconductor structure 102. The carrier channel 500 irradiates the periodic array 114 of the thin doped region 112.

FIG. 5B shows a zero-order transmission spectrum 502 for the periodic array 114 when the voltage source 118 does not apply a voltage or applies a selected non-zero voltage. The zero-order transmission spectrum 502 has a dominant wavelength at $\lambda_{cw}$, which is the wavelength of the electromagnetic carrier wave 500. Applying a second voltage state with the voltage source 118 changes the refractive index of the semiconductor structure 102 to cause the zero-order transmission spectrum 502 to shift to a zero-order transmission spectrum 503 having a dominant wavelength $\lambda_2$. As will be discussed in more detail below with respect to FIGS. 6A through 6D, by rapidly varying the voltage applied by the voltage source 118 to shift the zero-order transmission spectrums of the periodic array 114 from the zero-order transmission spectrum 502 to 503, the optical intensity of the carrier channel 500 may be modulated to produce an amplitude modulated carrier channel 504 carrying encoded information.

Figure 6A:
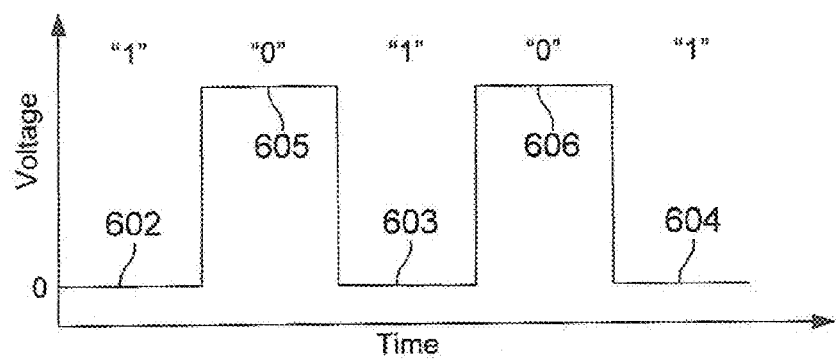
FIG. 6A is a graph of a periodic voltage pattern that can be applied to the photonic device shown in FIG. 5A to periodically vary the refractive index adjacent the periodic array of the photonic device according to one embodiment of the present invention.
Figure 6B:
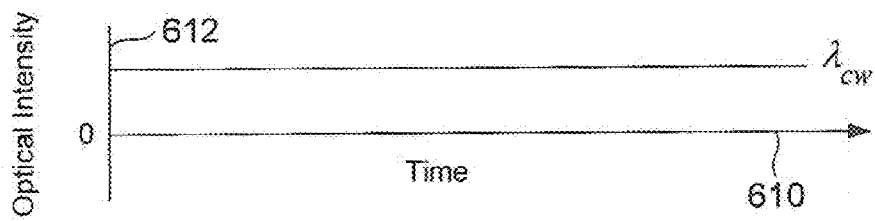
FIG. 6B is graph of the optical intensity of a carrier channel.
Figure 6C:
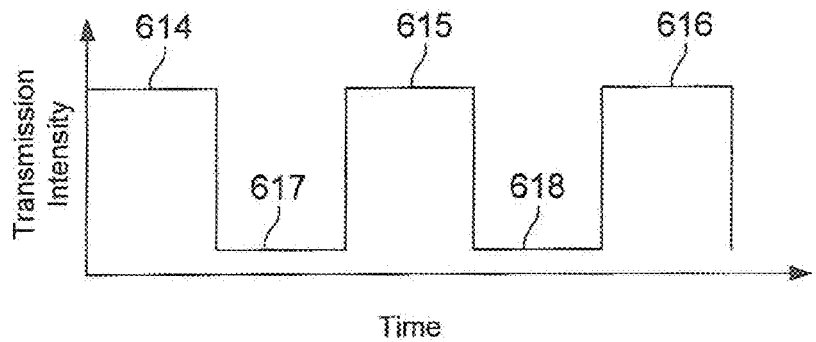
FIG. 6C is a graph of the time varying transmission intensity through the photonic device shown in FIG. 5A caused by application of the periodic voltage shown in FIG. 6A to the photonic device.

FIG. 6A shows a graph of a periodic voltage pattern 600 that may be applied to the semiconductor structure 102 using the voltage source 118 (FIG. 5A) to produce the amplitude modulated carrier channel 504 according to one embodiment of the present invention. It should be emphasized that the voltage pattern 600 is merely one example of a suitable voltage pattern and other voltage patterns may be used. The voltage pattern 600 encodes a five-digit binary number "10101" generated by the voltage source 118 shown in FIG. 5A. Relatively low voltage levels 602-604 correspond to the binary number "1," and relatively high voltage levels 605 and 606 correspond to the binary number "0." FIG. 6B shows a graph of the optical intensity of the carrier channel 500 versus time. The carrier channel 500 has a wavelength $\lambda_{cw}$.

Changes in the voltage level of the voltage pattern 600 shifts the zero-order transmission spectrum of the periodic array 114 (FIG. 5A) periodically from, for example, the zero-order transmission spectrum 502 (FIG. 5B) to the zero-order transmission spectrum 503 (FIG. 5B) by periodically varying the refractive index of the semiconductor structure 102 (FIG. 5A) adjacent to the periodic array 114. When the voltage applied by the voltage source 118 corresponds to the voltages 602-604 (which may be a zero voltage), a relatively high transmission 614-616 through the periodic array 114 may occur. When the voltage applied by the voltage source 118 corresponds to the voltages 605-606, the zero-order transmission spectrum 502 shifts to the zero-order transmission spectrum 503. As best shown in FIG. 5B, transmission of the carrier channel 500 with a wavelength $\lambda_{cw}$ through the periodic array 114 is relatively low or substantially zero in the zero-order transmission spectrum 503. Accordingly, a relatively low transmission 617-618 of the carrier channel 500 occurs through the periodic array 114 when the voltage corresponds to the voltages 605-606.

Figure 6D:
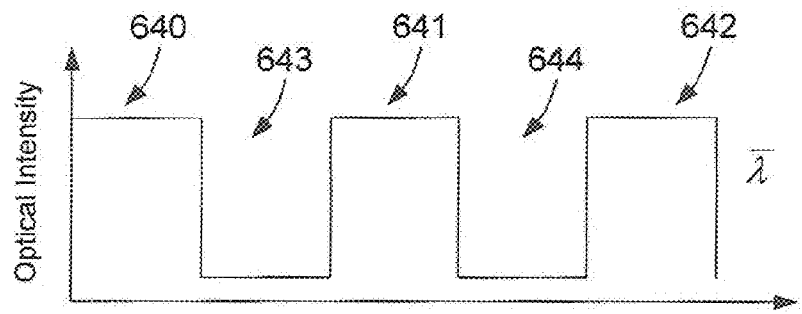
FIG. 6D is a graph of the time varying optical intensity of an encoded channel produced by modulating the voltage across the photonic device shown in FIG. 5A according to voltage pattern shown in FIG. 6A.

Applying a periodic voltage pattern 600 to the semiconductor structure 102 also modulates the optical intensity of the carrier channel 500. By modulating the optical intensity of the carrier channel 500, an amplitude modulated channel $\overline{\lambda}$ is generated. FIG. 6D shows the amplitude modulated channel $\overline{\lambda}$ generated by applying the periodic voltage pattern 600. As shown in FIG. 6D, periods 640-642 have a relatively large optical intensity, which correspond to the binary number "1" and low voltage levels 602-604, respectively, shown in FIG. 6A. The high optical intensity in the periods 640-642 are achieved during the time interval when refractive index of the semiconductor structure 102 is tuned so that the periodic array 114 exhibits the zero-order transmission spectrum 502 (FIG. 5B), as described above with reference to FIG. 6C. During the periods 643 and 644, the optical intensity has a relatively small magnitude, which correspond to the binary number "0" and high voltage levels 605 and 606, respectively. The low optical intensity periods 643 and 644 are achieved during time intervals when refractive index of the semiconductor structure 102 is tuned so that the periodic array 114 exhibits the zero-order transmission spectrum 503 (FIG. 5B) in which the transmission at the wavelength $\lambda_{cw}$ of the carrier channel 500 is substantially less than the transmission at the low voltage levels 602-604 and may be about zero.

It is noted that in other embodiments of the present invention, the intrinsic region 110 of the photonic device 100 shown in FIGS. 1 and 2 may be omitted. In such an embodiment, the semiconductor structure 102 is a p-n semiconductor structure having a p-n junction as opposed to a p-i-n semiconductor structure. The refractive index of the p-n semiconductor structure and, consequently, the zero-order transmission spectrum of the periodic array 114 may be controlled in a similar manner to the semiconductor structure 102 by injecting electrons into the p-semiconductor region 108.

Figure 7:
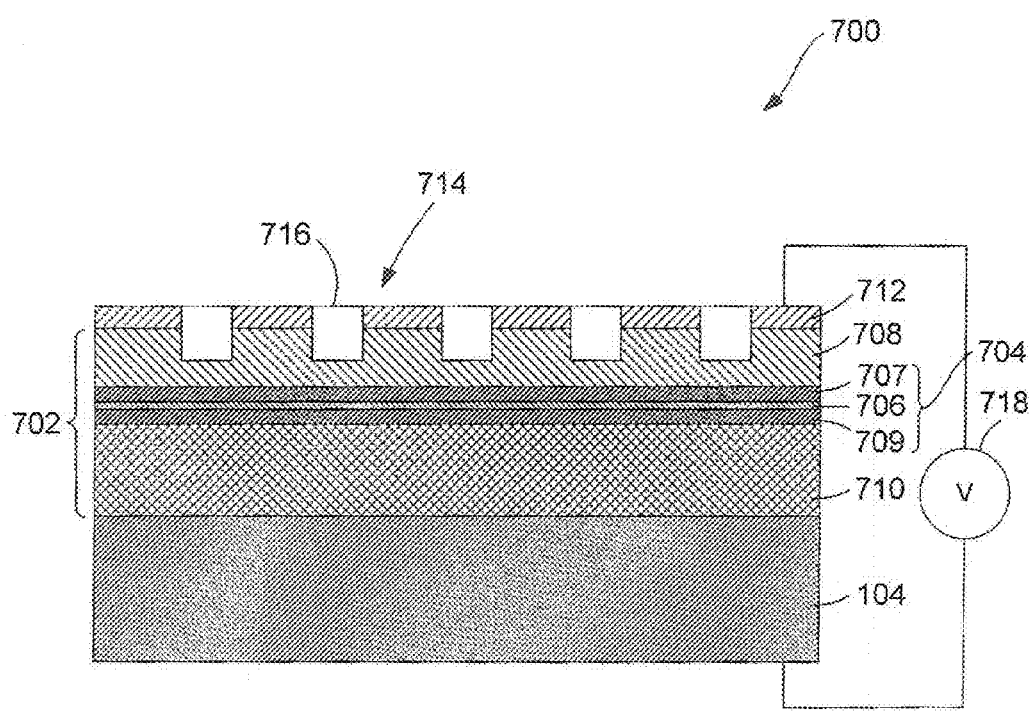
FIG. 7 is a schematic cross-sectional view of a photonic device including a quantum-well structure operable to provide gain at a wavelength of a carrier channel according to another embodiment of the present invention.
Figure 8:
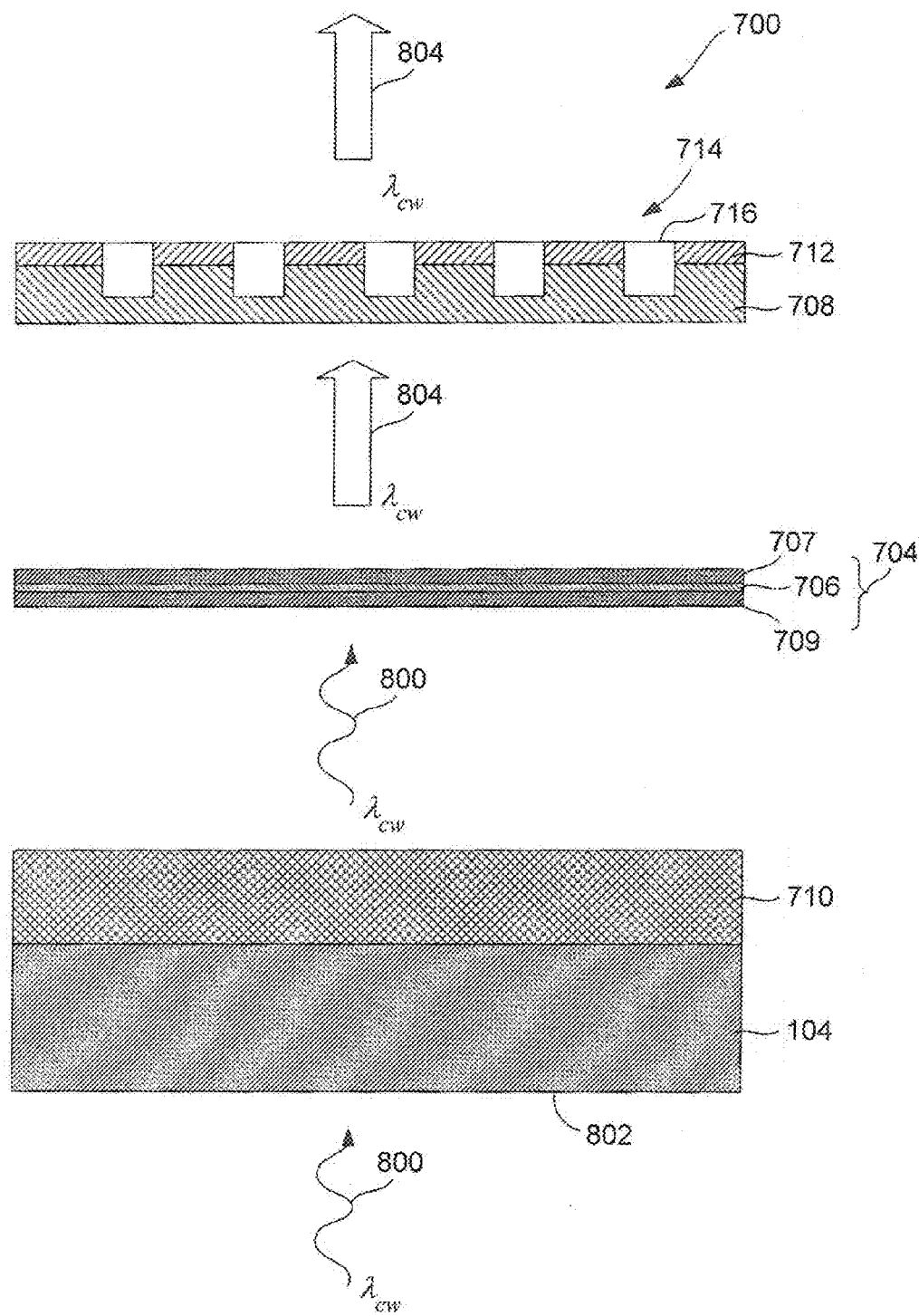
FIG. 8 is a schematic exploded cross-sectional view illustrating the operation of the photonic device shown in FIG. 7.

FIGS. 7 and 8 show a photonic device 700 according to another embodiment of the present invention. The photonic device 700 includes a semiconductor structure 702 formed on a substrate 104. The semiconductor structure 702 includes a quantum-well structure 704 that functions as a gain region to provide optical gain at a selected wavelength. The quantum-well structure 704 is sandwiched between a p-semiconductor region 708 and an n-semiconductor region 710. The photonic device 700 further includes a thin doped region 712 including a periodic array 714 having subwavelength-dimensioned recesses 716 extending into the p-semiconductor region 708. The periodic array 714 functions similarly to the periodic array 114 described above with respect to the photonic device 100 shown in FIG. 1. The photonic device 700 also includes a voltage source 718 operable to selectively apply a voltage across the semiconductor structure 702. Thus, the voltage source 718 enables selectively varying the refractive index of the semiconductor structure 702 adjacent to the periodic array 714. The voltage source 718 also enables promoting electrons into a selected quantized energy state within the quantum-well structure 704.

The quantum-well structure 704 further includes a relatively thin semiconductor layer 706 having a first energy band gap sandwiched between semiconductor layers 707 and 709. Each of the semiconductor layers 707 and 709 has a second energy band gap that is greater than that of the first energy band gap of the semiconductor layer 706. By properly selecting the semiconductor materials used to form the quantum-well structure 704 and the thickness of the semiconductor layer 706, along with application of an appropriate voltage with the voltage source 718, electrons tunnel into a selected energy state within the semiconductor layer 706. It should be noted that in other embodiments of the present invention, the quantum-well structure 704 may include two or more quantum wells.

The quantum-well structure 704 may be formed from a number of different materials. For example, the thin semiconductor layer 706 may be formed from gallium arsenide and the semiconductor layers 707 and 709 may each be formed from aluminum gallium arsenide. In such an embodiment, the n-semiconductor region 706 and the p-semiconductor region 708 may be appropriately doped gallium arsenide regions and the substrate 104 may be a gallium arsenide substrate. In another embodiment of the present invention, the thin semiconductor layer 706 may be formed from indium phosphide and the semiconductor layers 707 and 709 may each be formed from aluminum indium phosphide. In yet another embodiment of the present invention, the thin semiconductor layer 706 may be formed from silicon and the semiconductor layers 707 and 709 may each be formed from a silicon-germanium alloy. Forming the quantum-well structure 704 from silicon-based materials facilitates integrating the photonic device 700 with silicon-based integrated circuits.

As shown in FIG. 8, the quantum-well structure 704 may be used to increase the intensity of a carrier channel 800 having a wavelength $\lambda_{cw}$. During operation, the carrier channel 800 irradiates back surface 802 of the substrate 104 and is at least partially transmitted through the substrate 104 and the n-semiconductor region 712. During operation, the voltage source 718 applies a selected voltage to promote tunneling of electrons from one of the semiconductor layers 707 and 709 into a discrete energy level $E_h$ of the semiconductor layer 706. This tunneling effect creates a population inversion of electrons in the semiconductor layer 706 at the energy level $E_h$.

Still referring to FIG. 8, the transmitted carrier channel 800 is at least partially transmitted through the semiconductor layer 709 and into the semiconductor layer 706. The carrier channel 800 stimulates emission of electromagnetic radiation 804 from the tunneled electrons in the thin semiconductor layer 706 at the wavelength $\lambda_{cw}$. By proper selection of materials used for the quantum-well structure 704 and the applied voltage, the electronic structure of the thin semiconductor layer 706 of the quantum-well structure 704 exhibits a discrete energy level $E_h$ that electrons from one of the semiconductor layers 707 and 709 can tunnel into. The transmitted carrier channel 800 promotes transition of the tunneled electrons from the energy level $E_h$ to a lower energy level $E_l$ in the semiconductor layer 706 because the transmitted carrier channel 800 has a energy equal to the transition energy between the $E_h$ and the $E_l$ energy levels (i.e., $E_h$-$E_l$). Thus, the wavelength of the transition between the $E_h$ and the $E_l$ energy levels is $\lambda_{cw}$. As a result of the transition of the tunneled electrons to the lower energy level $E_l$, emission of stimulated electromagnetic radiation having the same wavelength $\lambda_{cw}$, phase, polarization, and wavevector as the transmitted carrier channel 800 occurs. In turn, the stimulated emission, promotes further transitions of the tunneled electrons from the energy level $E_h$, to the lower energy level $E_l$, in the semiconductor layer 706. Due the cascading emission of electromagnetic radiation in the semiconductor layer 706 at the wavelength $\lambda_{cw}$, the electromagnetic radiation 804 has a substantially greater intensity than the carrier channel 800. The stimulated electromagnetic radiation 804 is at least partially transmitted through the semiconductor layer 707 of the quantum-well structure 704, the p-semiconductor region 708, and the subwavelength-dimensioned recesses 716 of the periodic array 714.

The selected voltage that is applied to the semiconductor structure 702 to generate the population inversion in the quantum-well structure 704 also alters the refractive index of the semiconductor structure 702 adjacent to the periodic array 714. At the selected voltage applied by the voltage source 718, the combination of the periodic array 114 configuration and the refractive index of the semiconductor structure 702 adjacent to the periodic array 714 is selected so that the electromagnetic radiation 804 is transmitted through the periodic array 714. In one embodiment of the present invention, at the selected voltage applied by the voltage source 718, the combination of the periodic array 114 configuration and the refractive index of the semiconductor structure 702 adjacent to the periodic array 714 is selected so that the zero-order transmission spectrum through the periodic array 714 is similar to the zero-order transmission spectrum 502 shown in FIG. 5B, with the dominant wavelength of the zero-order transmission spectrum at the wavelength $\lambda_{cw}$ of the electromagnetic radiation 804. In another embodiment of the present invention, the quantum-well structure 704 is designed so that gain at the wavelength $\lambda_{cw}$ is maximized at the selected applied voltage in addition to the wavelength $\lambda_{cw}$ of the electromagnetic radiation 804 being the dominant wavelength of the zero-order transmission spectrum through the periodic array 714.

As with the photonic device 100, the photonic device 700 may be operated as an electro-optic modulator by applying a periodic voltage using the voltage source 718 to produce an amplitude modulated channel similar to the amplitude modulated channel $\overline{\lambda}$ shown in FIG. 6D. For example, the voltage pattern 600 may be applied to the semiconductor structure 702, and the voltage levels 605-606 may be selected to generate the population inversion in the quantum-well structure 704 and tune the refractive index of the semiconductor structure 702 adjacent to the periodic array 714 to allow transmission at the wavelength $\lambda_{cw}$, with the wavelength $\lambda_{cw}$ being the dominant wavelength of the zero-order transmission spectrum. Application of the voltage levels 602-604 may be such that no population inversion is created in the quantum-well structure 704 and, additionally, the refractive index of the semiconductor structure 702 adjacent to the periodic array 714 is such that substantially no transmission of the carrier channel 800 at the wavelength the wavelength $\lambda_{cw}$ is transmitted through the periodic array 714.

Figure 9:
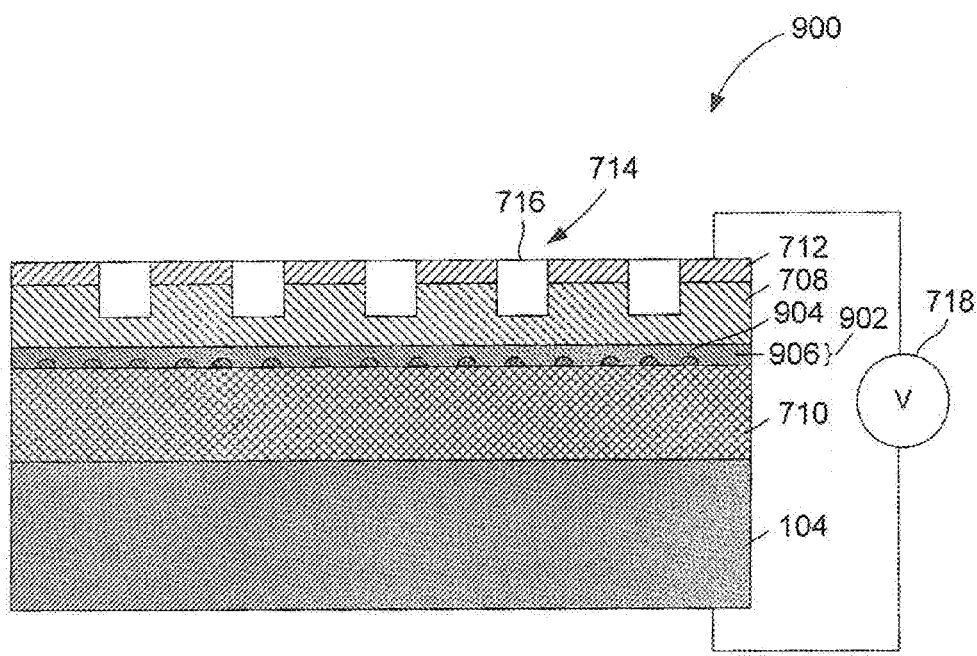
FIG. 9 is a schematic cross-sectional view of a photonic device including a gain region having a number of quantum dots operable to provide gain at a wavelength of a carrier channel according to another embodiment of the present invention.

In a further embodiment of the present invention, a number of quantum dots may be used instead of a quantum-well structure for increasing the intensity of a carrier channel transmitted through the photonic device 700 at the wavelength $\lambda_{cw}$. For example, FIG. 9 shows a photonic device 900 according to yet another embodiment of the present invention in which quantum dots function as the gain medium. In the interest of brevity, common components between the photonic device 900 and the photonic device 700 shown in FIG. 7 use the reference numerals. The quantum-well structure 704 of the photonic device 700 is replaced with a quantum-dot structure 902. The quantum-dot structure 902 includes a number of quantum dots 904 that may be deposited or grown on the n-semiconductor region 710. Each of the quantum dots 904 is made from a semiconductor material and includes a number of quantized electronic states that electrons can be excited into by application of a stimulus. For example, each of the quantum dots 904 may be made from III-V semiconductor compounds (e.g., InP, GaAs, gallium nitride ("GaN"), etc.) grown by molecular beam epitaxy on the substrate 104. The quantum dots 904 are embedded in a matrix 906 made from a semiconductor material, such as doped or undoped InP, indium gallium phosphide ("InGaP"), indium gallium arsenide phosphide ("InGaAsP"), GaAs, or GaN.

The quantum-dot structure 902 serves the same function as the quantum-well structure 704 of the photonic device 700 shown in FIG. 7. Namely, application of an appropriate voltage by the voltage source 718 excites electrons in the quantum dots 904 to an excited electronic state. Similarly to the operation of the photonic device 700, a carrier channel having a wavelength $\lambda_{cw}$ stimulates emission of electromagnetic radiation at the same wavelength $\lambda_{cw}$ from the quantum dots 904 that is transmitted through the periodic array 714.

Figure 10:
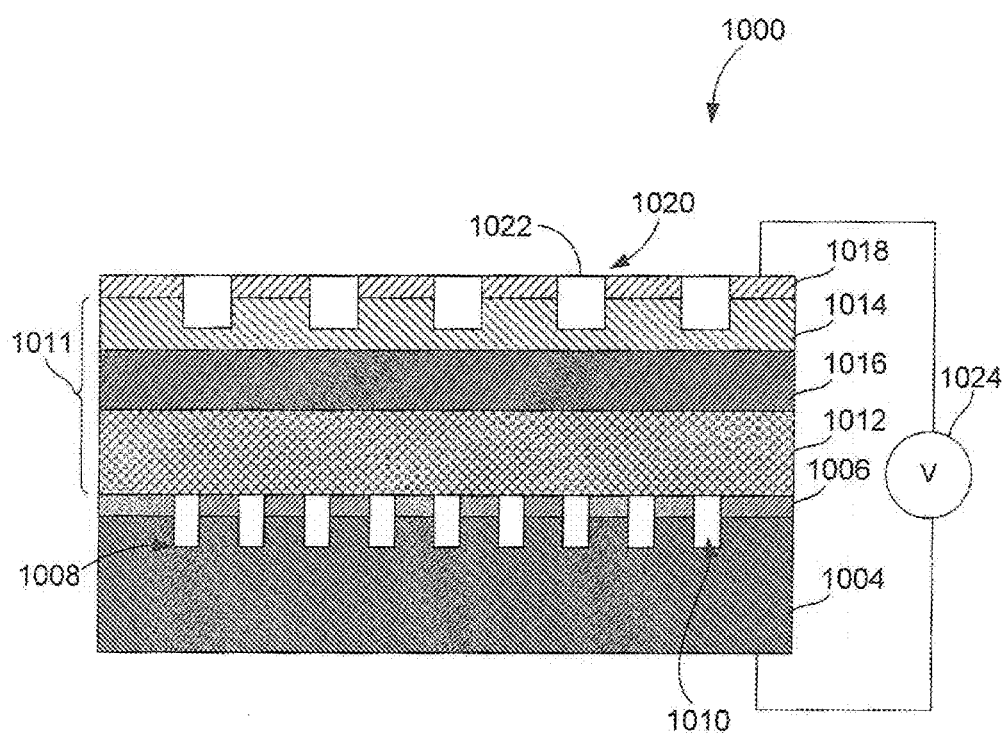
FIG. 10 is a schematic cross-sectional view of a photonic device including two different periodic arrays in series according to yet another embodiment of the present invention.

Photonic devices according to certain embodiments of the present invention include at least two periodic arrays in series to provide improved filtering. FIG. 10 shows a photonic device 1000 according to yet another embodiment of the present invention in which the photonic device 1000 includes two periodic arrays in series to provide improved filtering. The photonic device 1000 includes a substrate 1004 having a thin doped region 1006 formed therein. For example, the thin doped region 1006 may be a delta-doped region, as previously described. The thin doped region 1006 includes a first periodic array 1008 having a number of subwavelength-dimensioned recesses 1010 that extend into the substrate 1004. The photonic device 1012 also includes a semiconductor structure 1011 formed on the doped region 1006. The semiconductor structure 1011 includes an n-semiconductor region 1012, a p-semiconductor region 1014, and an intrinsic region 1016 located therebetween. As previously described with respect to the photonic device 100, a thin doped region 1018 is formed on or within the p-semiconductor region 1014. For example, the thin doped region 1018 may be a delta-doped region. The thin doped region 1018 includes a second periodic array 1020 having recesses 1022 that extend into the p-semiconductor region 1014. The first periodic array 1008 has a zero-order transmission spectrum that is broader than a zero-order transmission spectrum of the second periodic array 1020. The photonic device 1000 may also include a voltage source 1024 for controlling the refractive index of the semiconductor structure 1011 to tune the zero-order transmission spectrum through the first and second periodic arrays 1008 and 1020.

Figure 11:
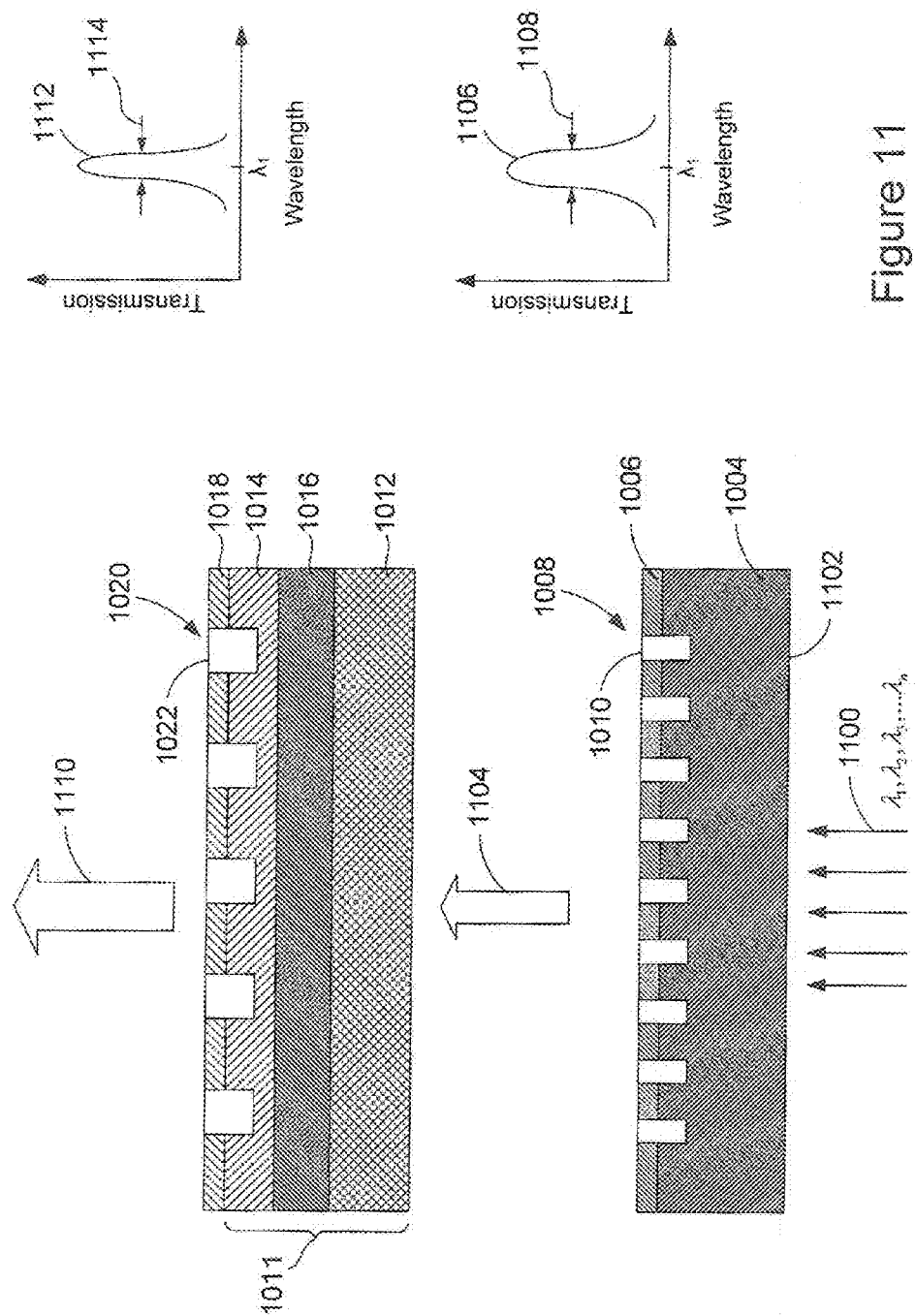
FIG. 11 is a schematic exploded cross-sectional view illustrating the operation of the photonic device shown in FIG. 10.

As shown in FIG. 11, in operation, electromagnetic radiation having a wide range of wavelengths $\lambda_1, \lambda_2, \lambda_3 \ldots \lambda_n$ may be directed at a back surface 1102 of the substrate 1004. The first periodic array 1008 is configured so that only a narrow range of wavelengths is transmitted therethrough. The first periodic array 1008 is configured to allow electromagnetic radiation 1104 to be transmitted through the first periodic array 1008, with a zero-order transmission spectrum 1106 having a selected dominant wavelength $\lambda_1$. The zero-order transmission spectrum 1106 has a width 1108 at half maximum. The electromagnetic radiation 1104 is at least partially transmitted through the semiconductor structure 1011 and only a portion of the electromagnetic radiation 1104 passes through the second periodic array 1020. As illustrated, the second periodic array 1020 allows electromagnetic radiation 1110 to be transmitted therethrough with a zero-order transmission spectrum 1112 having the same dominant wavelength $\lambda_1$ as the zero-order transmission spectrum 1106. However, the zero-order transmission spectrum 1112 has a width 114 at half maximum that is less than the width 1108. Accordingly, the combination of the first and second periodic arrays 1008 and 1020 provide for a narrower zero-order transmission spectrum centered at the dominant wavelength $\lambda_1$. Additionally, as with the previously described embodiments, application of a selected voltage with the voltage source 1024 may be used to selectively alter the zero-order transmission spectrums 1106 and 1112 through each of the first and second periodic arrays 10080 and 1020.

Figure 12:
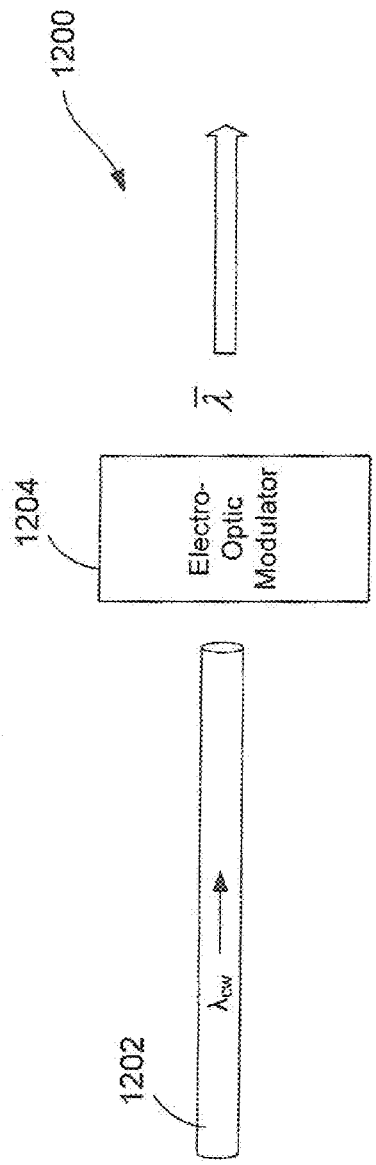
FIG. 12 is a diagram of an optical fiber system that may employ any of the disclosed electro-optic modulators according to one embodiment of the present invention.

The disclosed embodiments of photonic devices may be used in a number of different applications. FIG. 12 shows an optical fiber system 1200 according to one embodiment of the present invention. The optical fiber system 1200 includes an optical fiber 1202 configured for transmitting a carrier channel having a wavelength $\lambda_{cw}$. The optical fiber system 1200 further includes an electro-optic modulator 1204 configured as any of the disclosed embodiments of photonic devices operable as an electro-optic modulator. During operation, the carrier channel $\lambda_{cw}$ is transmitted through the optical fiber 1202 to the electro-optic modulator, which modulates the carrier channel $\lambda_{cw}$ to produce an amplitude modulated channel $\bar{\lambda}$, as previously described.

Figure 13:
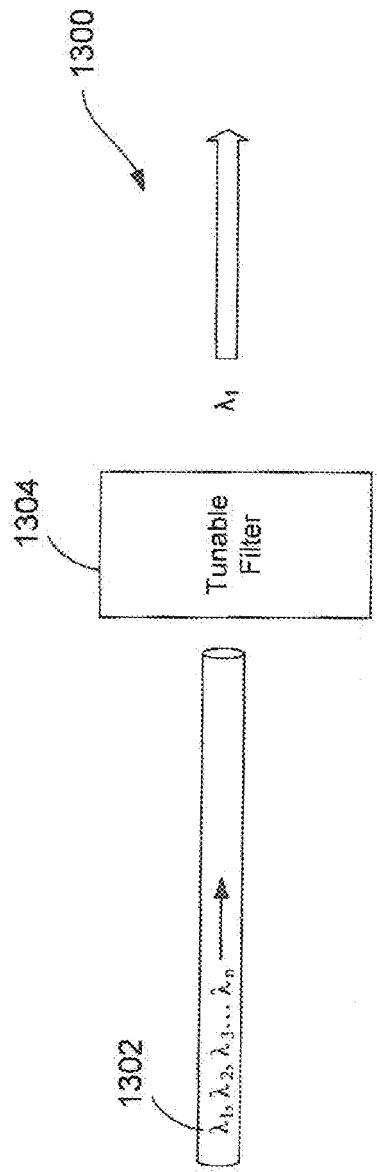
FIG. 13 is a diagram of an optical fiber system that may employ any of the disclosed tunable filters according to another embodiment of the present invention.

FIG. 13 shows an optical fiber system 1300 according to another embodiment of the present invention. The optical fiber system 1300 includes an optical fiber 1302 configured to transmit multiple encoded channels or carrier channels $\lambda_1, \lambda_2, \lambda_3 \ldots \lambda_n$. The optical fiber system 1300 further includes a tunable filter 1304 configured as any of the disclosed embodiments of photonic devices operable as a tunable filter. In operation, the multiple encoded channels or carrier channels $\lambda_1, \lambda_2, \lambda_3 \ldots \lambda_n$ are transmitted through the optical fiber 1302 to the tunable filter 1304. The tunable filter 1304 selectively transmits only one of the encoded channels or carrier channels $\lambda_1, \lambda_2, \lambda_3 \ldots \lambda_n$ at a time.

Figure 14:
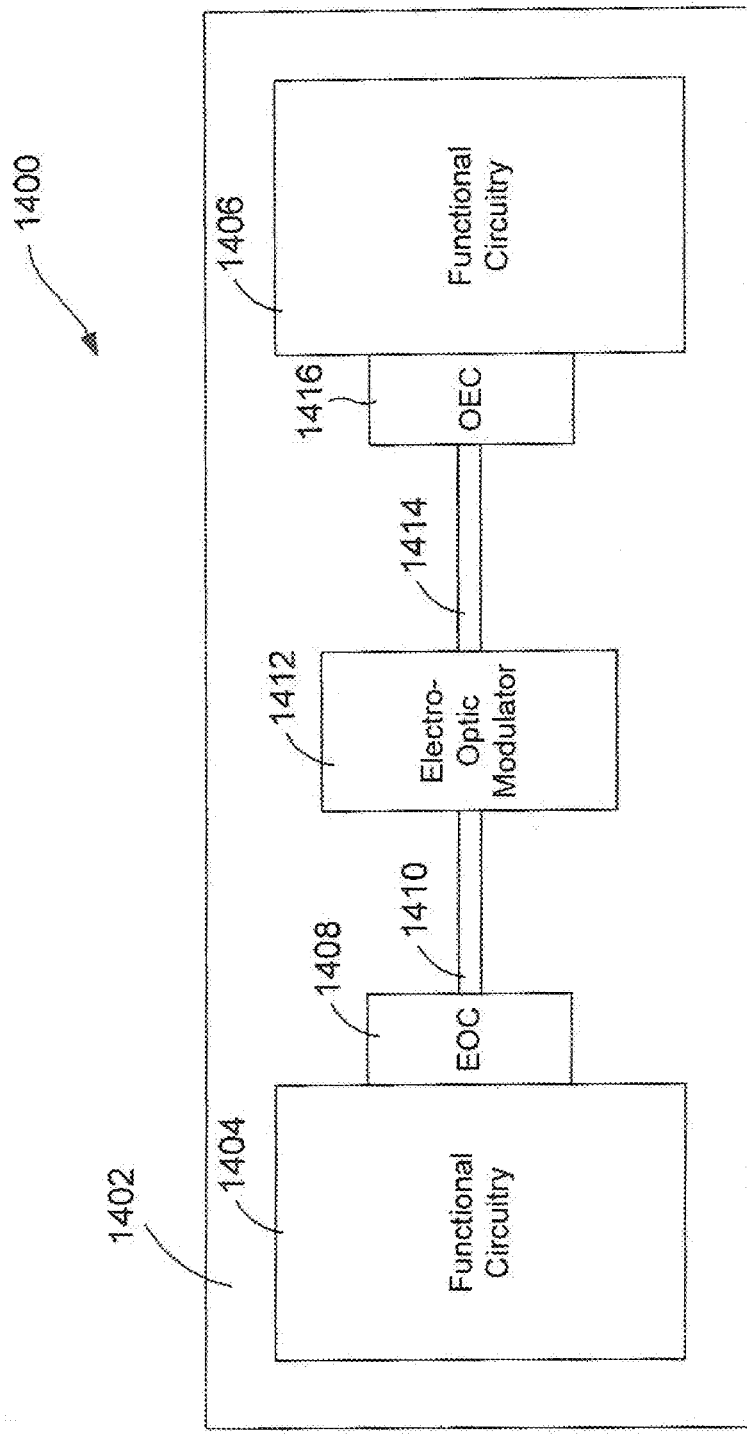
FIG. 14 is a functional block diagram of a PIC that may employ any of the disclosed electro-optic modulators according to yet another embodiment of the present invention.

FIG. 14 shows a PIC 1400 according to another embodiment of the present invention. The PIC 1400 may employ any of the disclosed embodiments of photonic devices operable as an electro-optic modulator. The PIC 1400 includes a substrate 1402 that includes functional circuitry 1404 and 1406. For example, the substrate 1402 may be a silicon substrate and the functional circuitry 1404 and 1406 may be CMOS circuitry. The functional circuitry 1404 may be configured to perform processing functions and the functional circuitry 1406 may be configured to perform memory functions. An electrical-to-optical converter ("EOC") 1408, such as a laser diode, outputs a carrier channel $\lambda_{cw}$ to an electro-optic modulator 1412 via a waveguide 1410 responsive to electrical signals from the functional circuitry 1404. The electro-optic modulator 1412 may be configured as any of the disclosed photonic devices operable as an electro-optic modulator. The electro-optic modulator modulates the carrier channel $\lambda_{cw}$ to produce an amplitude modulated channel $\bar{\lambda}$, as previously described. The amplitude modulate channel $\bar{\lambda}$, is transmitted to an optical-to-electrical converter ("OEC") 1416, such as a PIN photodiode, via a waveguide 1414. The OEC 1416 is operable to convert the amplitude modulate channel $\bar{\lambda}$ to an encoded electrical signal that is further transmitted to the functional circuitry 1406.

Figure 15:
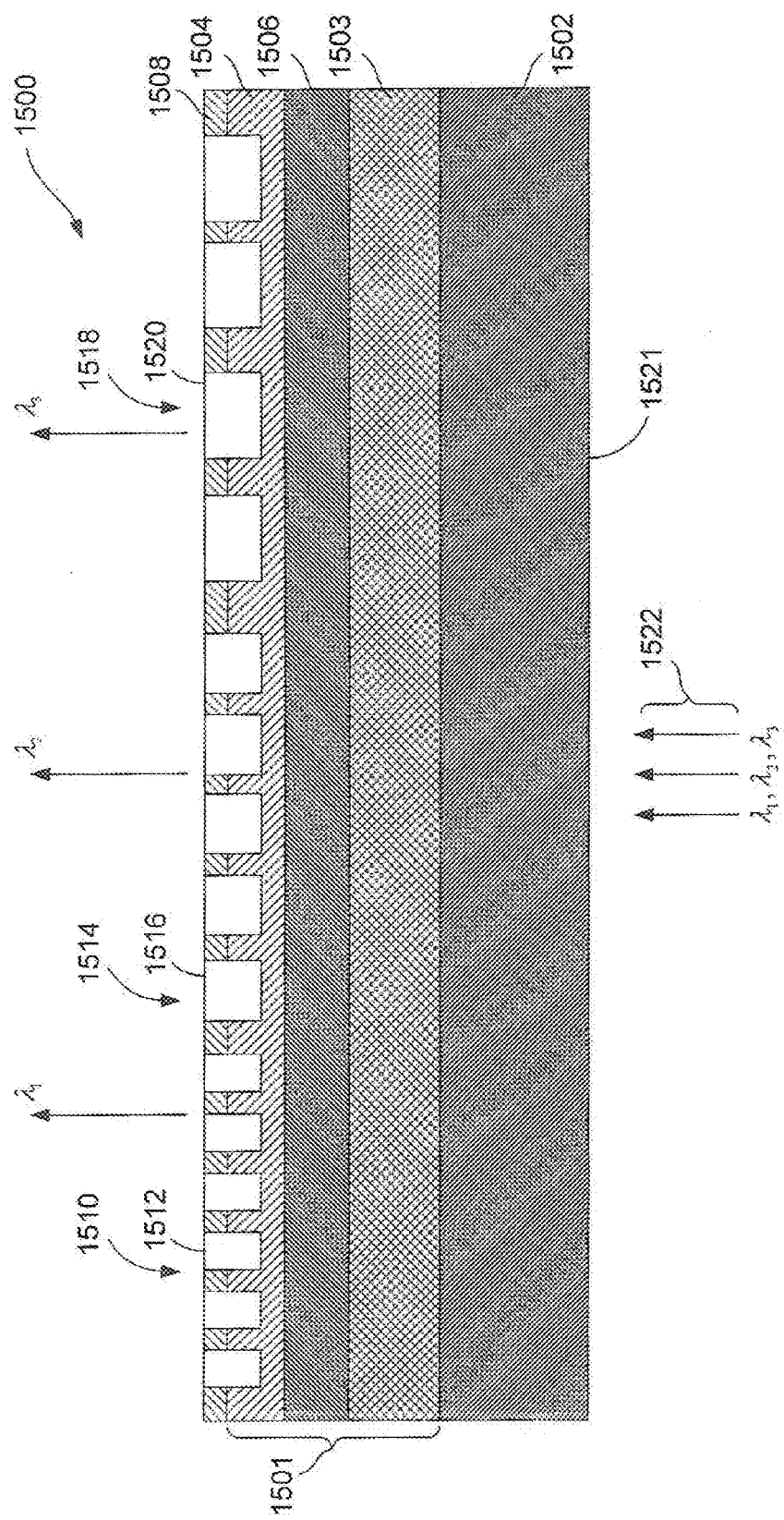
FIG. 15 is a schematic cross-sectional view of a photonic device that includes a doped region having a number of different periodic arrays according to another embodiment of the present invention.

The photonic devices 100, 700, 900, and 1000 described above only transmit a single zero-order transmission spectrum at a time. However, simultaneous transmission of different zero-order transmission spectrums through a photonic device may be useful in certain applications, such as flat panel displays. FIG. 15 shows a photonic device 1500 according to yet another embodiment of the present invention. The photonic device 1500 includes a number of different periodic arrays formed in a doped region, with each of the periodic arrays configured to transmit electromagnetic radiation at a different dominant wavelength. The photonic device 1500 includes a substrate 1502 on which a semiconductor structure 1501 is formed. The semiconductor structure 1501 includes a p-semiconductor region 1503, an n-semiconductor region 1504, and an intrinsic region 1506 therebetween. A thin doped region 1508 may be formed on or within the p-semiconductor region 1504, as previously described. The doped region 1508 includes a first periodic array 1510 with subwavelength-dimensioned recesses 1512, a second periodic array 1514 with subwavelength-dimensioned recesses 1516, and a third periodic array 1518 with subwavelength-dimensioned recesses 1520. Each of the periodic arrays 1510, 1514, and 1518 is configured to transmit electromagnetic radiation having a zero-order transmission spectrum with a different dominant wavelength. For example, the geometry and/or recess spacing may be different in each of the periodic arrays 1510, 1514, and 1518.

In operation, electromagnetic radiation including wavelengths $\lambda_1$, $\lambda_2$, and $\lambda_3$ irradiates back surface 1521 of the substrate 1502. The first periodic array 1510 allows transmission of electromagnetic radiation having a zero-order transmission spectrum with a dominant wavelength $\lambda_1$, the second periodic array 1514 allows transmission of electromagnetic radiation having a zero-order transmission spectrum with a dominant wavelength $\lambda_2$, and the third periodic array 1518 allows transmission of electromagnetic radiation having a zero-order transmission spectrum with a dominant wavelength $\lambda_3$. Of course, in other embodiments of the present invention, more or less than three periodic arrays may be formed in the doped region 1508.

FIGS. 16 and 17 show a photonic device 1600 according to another embodiment of the present invention. The photonic device 1600 is configured so that different array regions of a periodic array with subwavelength recesses transmit different zero-order transmission spectrums therethrough. The photonic device 1600 includes a substrate 1602 on which a semiconductor structure 1601 is formed. The semiconductor structure 1601 includes an n-semiconductor region 1603, a p-semiconductor region 1604, and an intrinsic region 1606 therebetween. A thin doped region 1608 may be formed on or within the p-semiconductor region 1604, as previously described. The doped region 1608 includes a periodic array 1610 with subwavelength-dimensioned recesses 1612.

As illustrated in FIG. 17, the dopant concentration in the doped region 1608 varies laterally across the doped region 1608. Such a dopant profile may be formed by selectively depositing dopant on the p-semiconductor region 1604 followed by annealing to diffuse the dopant into the p-semiconductor region 1604. For example, the dopant may be selectively deposited on the p-semiconductor region 1604 by appropriately masking and depositing the dopant or another suitable technique. For example, the doped region 1608 may include array regions 1614, 1616, and 1618 that have dopant concentration $C_1$, $C_2$, and $C_3$, respectively. By varying the dopant concentration, the bulk plasma frequency in each of the array regions 1614, 1616, and 1618 may vary because the free-electron concentration varies in each array region 1614, 1616, and 1618. Consequently, each array region 1614, 1616, and 1618 is configured to transmit electromagnetic radiation having a zero-order transmission spectrum with different dominant wavelengths.

In operation, electromagnetic radiation including wavelengths $\lambda_1$, $\lambda_2$, and $\lambda_3$ irradiates back surface 1621 of the substrate 1602. The array region 1614 of the periodic array 1610 allows transmission of electromagnetic radiation having a zero-order transmission spectrum with a dominant wavelength $\lambda_1$, the array region 1616 of the periodic array 1610 allows transmission of electromagnetic radiation having a zero-order transmission spectrum with a dominant wavelength $\lambda_2$, and the array region 1618 of the periodic array 1610 allows transmission of electromagnetic radiation having a zero-order transmission spectrum with a dominant wavelength $\lambda_3$. Of course, in other embodiments of the present invention, more than three periodic arrays may be formed in the doped region 1508. Moreover, the dopant profile shown in FIG. 17 merely represents one example of a suitable dopant profile. In another embodiment of the present invention, the dopant profile may be a continuously varying linear dopant profile or another suitable dopant profile.

Although the present invention has been described in terms of particular embodiments, it is not intended that the present invention be limited to these embodiments. Modifications within the spirit of the present invention will be apparent to those skilled in the art. For example, in other embodiments of the present invention, the intrinsic region of the various disclosed photonic devices may be omitted. In such embodiments, a p-n junction is form instead of a p-i-n semiconductor structure that also enables controlling the refractive index of the material adjacent to the periodic array. Also, as discussed above, the illustrated subwavelength-dimensioned recesses are merely one particular recess configuration. Periodic arrays with different recess shapes may also be used for tuning a zero-order transmission spectrum of the periodic array. In yet another embodiment of the present invention, dye molecules embedded in an optical medium, such as a polymer or glass, may be used instead of quantum dots in the embodiment shown in FIG. 9.

The foregoing description, for purposes of explanation, used specific nomenclature to provide a thorough understanding of the present invention. However, it will be apparent to one skilled in the art that the specific details are not required in order to practice the present invention. The foregoing descriptions of specific embodiments of the present invention are presented for purposes of illustration and description. They are not intended to be exhaustive of or to limit the present invention to the precise forms disclosed. Many modifications and variations are possible in view of the above teachings. The embodiments are shown and described in order to best explain the principles of the present invention and its practical applications, to thereby enable others skilled in the art to best utilize the present invention and various embodiments with various modifications as are suited to the particular use contemplated. It is intended that the scope of the present invention be defined by the claims and their equivalents:

The invention claimed is:

1. A photonic device, comprising:
   a semiconductor structure including a p-region, an n-region, and a gain region located between the n-region and the p-region; and
   a doped region formed on or within the semiconductor structure, the doped region including at least one generally periodic array of recesses, the at least one generally periodic array configured to transmit electromagnetic radiation at a selected dominant wavelength, the selected dominant wavelength tunable by varying the refractive index of the semiconductor structure, and the gain region operable to provide gain at the selected dominant wavelength that is transmitted through the at least one generally periodic array.

2. The photonic device of claim 1 wherein the gain region comprises a quantum-well structure.

3. The photonic device of claim 1 wherein the gain region comprises one of:
   a number of quantum dots; and
   dye molecules.

4. The photonic device of claim 1, further comprising:
   a voltage source configured to apply a voltage across the semiconductor structure and the doped region to selectively vary a refractive index of the semiconductor structure and a value of the selected dominant wavelength.

5. The photonic device of claim 1 wherein the doped region has a delta-doped profile.

6. The photonic device of claim 1 wherein each of the recesses of the at least one array extends to at least a depth of the doped region.

7. The photonic device of claim 1 wherein the doped region exhibits a dopant concentration that varies laterally across the doped region, the selected dominant wavelength that can be transmitted through the at least generally periodic array varying depending upon the dopant concentration.

8. The photonic device of claim 1 wherein the at least one generally periodic array comprises a number of generally periodic arrays, each of the number of generally periodic arrays configured to transmit electromagnetic radiation at different selected dominant wavelengths.

9. The photonic device of claim 1, further comprising:
   a substrate including an additional doped region formed on or within the substrate, the additional doped region including an additional generally periodic array of recesses, the additional doped region positioned adjacent to a side of the semiconductor structure opposite the doped region, the additional generally periodic array configured to transmit electromagnetic radiation at the selected dominant wavelength.

10. An optical fiber system comprising the photonic device of claim 1.

11. A photonic integrated circuit comprising the photonic device of claim 1.

12. A photonic device, comprising:
    a semiconductor structure including a p-region, an n-region, and an intrinsic region located between the n-region and the p-region; and
    a doped region formed on or within the semiconductor structure, the doped region including at least one generally periodic array of recesses, the at least one generally periodic array configured to transmit electromagnetic radiation at a selected dominant wavelength, the selected dominant wavelength tunable by varying the refractive index of the semiconductor structure.

13. The photonic device of claim 12, further comprising:
    a voltage source configured to apply a voltage across the semiconductor structure and the doped region to selectively vary a refractive index of the semiconductor structure and a value of the selected dominant wavelength.

14. The photonic device of claim 12 wherein the doped region has a delta-doped profile.

15. The photonic device of claim 12 wherein each of the recesses of the at least one array extends to at least a depth of the doped region.

16. The photonic device of claim 12 wherein the doped region exhibits a dopant concentration that varies laterally across the doped region, the selected dominant wavelength that can be transmitted through the at least generally periodic array varying depending upon the dopant concentration.

17. The photonic device of claim 12 wherein the at least one generally periodic array comprises a number of generally periodic arrays, each of the number of generally periodic arrays configured to transmit electromagnetic radiation at different selected dominant wavelengths.

18. The photonic device of claim 12, further comprising:
    a substrate including an additional doped region formed on or within the substrate, the additional doped region including an additional generally periodic array of recesses, the additional doped region positioned adjacent to a side of the semiconductor structure opposite the doped region, the additional generally periodic array configured to transmit electromagnetic radiation at the selected dominant wavelength.

19. An optical fiber system comprising the photonic device of claim 12.

20. A photonic integrated circuit comprising the photonic device of claim 12.

21. A method of encoding a carrier channel, comprising:
irradiating, with the carrier channel, at least one generally periodic array of recesses formed in a doped region positioned adjacent to a semiconductor structure; and
modulating an intensity of the carrier channel passing through the at least one generally periodic array of recesses by modulating the refractive index of the semiconductor structure, wherein the semiconductor structure comprises a gain medium, and the carrier channel that irradiates the at least one generally periodic array is generated, in part, by stimulating emission of electromagnetic radiation from the gain medium.

22. The method of claim 21 wherein modulating the refractive index of the semiconductor structure comprises modulating a voltage applied across the semiconductor structure.

23. The method of claim 21 wherein the semiconductor structure comprises a p-region, an n-region, and an intermediate region there between, the doped region formed within one of the p-region and the n-region.

24. The method of claim 21:
further comprising modulating gain provided by the gain medium;
wherein the act of modulating an intensity of the carrier channel passing through the at least one generally periodic array of recesses and the act of modulating gain provided by the gain medium is performed so that gain is maximized when the intensity transmitted through the at least one generally periodic array of recesses is maximized.

25. A method of filtering electromagnetic radiation having a range of wavelengths, comprising;
irradiating, with the electromagnetic radiation, at least one generally periodic array of recesses formed in a doped region positioned adjacent to a semiconductor structure;
transmitting only a portion of the electromagnetic radiation through the at least one generally periodic array, wherein the transmitted electromagnetic radiation exhibits a transmission spectrum having a selected dominant wavelength; and
controlling the selected dominant wavelength transmitted through the at least one generally periodic array by selectively varying the refractive index of the semiconductor structure.

* * * * *

UNITED STATES PATENT AND TRADEMARK OFFICE
CERTIFICATE OF CORRECTION

PATENT NO. : 7,701,629 B2  Page 1 of 1
APPLICATION NO. : 11/788445
DATED : April 20, 2010
INVENTOR(S) : Shih-Yuan Wang et al.

It is certified that error appears in the above-identified patent and that said Letters Patent is hereby corrected as shown below:

On the Title page, in field (54), Title, in column 1, line 4, delete "SUBWAVELENGH" and insert -- SUBWAVELENGTH --, therefor.

In column 1, line 4, delete "SUBWAVELENGH" and insert -- SUBWAVELENGTH --, therefor.

In column 16, line 9, in Claim 25, delete "comprising;" and insert -- comprising: --, therefor.

Signed and Sealed this

Fifth Day of October, 2010

David J. Kappos
*Director of the United States Patent and Trademark Office*